(12) United States Patent
Sato et al.

(10) Patent No.: US 7,988,786 B2
(45) Date of Patent: Aug. 2, 2011

(54) CARBON FILM COATED MEMBER

(75) Inventors: Michio Sato, Yokohama (JP); Takashi Yamanobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/993,512

(22) Filed: Nov. 22, 2004

(65) Prior Publication Data

US 2006/0040105 A1 Feb. 23, 2006

Related U.S. Application Data

(63) Continuation of application No. 10/224,345, filed on Aug. 21, 2002, now abandoned.

(30) Foreign Application Priority Data

Aug. 21, 2001 (JP) .................................. 2001-250621
Dec. 4, 2001 (JP) .................................. 2001-369990

(51) Int. Cl.
*H01L 21/02* (2006.01)

(52) U.S. Cl. ........ 118/728; 118/722; 118/726; 118/727; 428/408; 428/336; 428/698

(58) Field of Classification Search .................. 118/722, 118/723, 726, 727, 728; 428/408, 336, 469, 428/472, 698, 704
See application file for complete search history.

(56) References Cited

U.S. PATENT DOCUMENTS

| | | | |
|---|---|---|---|
| 5,010,249 A | 4/1991 | Nishikawa | |
| 5,164,595 A | 11/1992 | Musselman et al. | |
| 5,249,554 A | 10/1993 | Tamor et al. | |
| 5,270,543 A | 12/1993 | Visser et al. | |
| 5,368,937 A * | 11/1994 | Itoh | 428/408 |
| 5,368,939 A | 11/1994 | Kawamura et al. | |
| 5,383,354 A | 1/1995 | Doris et al. | |
| 5,763,879 A | 6/1998 | Zimmer et al. | |
| 5,786,068 A * | 7/1998 | Dorfman et al. | 428/698 |

(Continued)

FOREIGN PATENT DOCUMENTS

EP 527 133 * 2/1993

(Continued)

OTHER PUBLICATIONS

J.S. Wang et al., "The mechanical performance of DLC films on steel substrates", Elsevier Science S.A. Thin Solid Films 325, (1998) pp. 163-174.

(Continued)

*Primary Examiner* — Archene Turner
(74) *Attorney, Agent, or Firm* — Foley & Lardner LLP

(57) ABSTRACT

The present invention provides a carbon film coated member comprising: a base material; and a coated film formed on at least part of a surface of the base material, the coated film comprising: a matrix composed of amorphous carbon; and at least one of metal and metal carbide contained in the matrix, wherein an atomic ratio (M/C) of the metal (M) to carbon (C) constituting the coated film is 0.01 to 0.7. According to the above structure, there can be provided a carbon film coated member excellent in low-friction property, wear resistance and durability, and capable of suppressing a dust generation, peeling-off and deterioration of the coated film even if the carbon film coated member is used as semiconductor equipment members such as wafer cassette, dummy wafer, probe pin or the like under severe operating conditions, so that the carbon film coated member would not exert a bad influence onto the resultant semiconductor products.

7 Claims, 3 Drawing Sheets

U.S. PATENT DOCUMENTS

| | | | |
|---|---|---|---|
| 5,952,060 A * | 9/1999 | Ravi | 118/722 |
| 6,284,376 B1 * | 9/2001 | Takenouchi et al. | 428/408 |
| 6,508,911 B1 * | 1/2003 | Han et al. | 118/723 R |
| 6,537,429 B2 * | 3/2003 | O'Donnell et al. | 428/408 |
| 6,652,969 B1 * | 11/2003 | Murakami et al. | 428/408 |
| 6,740,393 B1 * | 5/2004 | Massler et al. | 428/216 |
| 6,821,624 B2 | 11/2004 | Utsumi et al. | |
| 6,869,676 B2 * | 3/2005 | Burger et al. | 428/336 |
| 7,067,191 B2 * | 6/2006 | Derflinger et al. | 428/408 |

FOREIGN PATENT DOCUMENTS

| | | |
|---|---|---|
| EP | 0 579 983 A1 | 6/1993 |
| EP | 1 114 881 A1 | 7/2001 |
| JP | 62-185879 A | 8/1987 |
| JP | 4-103777 A | 4/1992 |
| JP | 05-279854 A | 10/1993 |
| JP | 06-212429 A | 8/1994 |
| JP | 09-237824 A | 9/1997 |
| JP | 10-110270 | 4/1998 |
| JP | 10-221366 A | 8/1998 |
| JP | 10-270433 A | 10/1998 |
| JP | 11-029880 A | 2/1999 |
| JP | 11-102847 A | 4/1999 |
| JP | 11-254093 A | 9/1999 |
| JP | 11-315924 | 11/1999 |
| JP | 2000-039446 A | 2/2000 |
| JP | 2000-96233 A | 4/2000 |
| JP | 2000-119843 A | 4/2000 |
| JP | 2000-290776 A | 10/2000 |
| JP | 2001-004698 | 1/2001 |
| JP | 2001-316800 A | 11/2001 |
| WO | 99/55929 * | 11/1999 |

OTHER PUBLICATIONS

K. Bewilogua et al., "Erratum to: Effect of target material on deposition and properties of metal-containing DLC (Me-DLC) coatings", Elsevier Science S.A., Surface and Coatings Technology 132, (2000), pp. 275-283.

W.J. Meng et al., "Mechanical properties of Ti-containing and W-containing diamond-like carbon coatings", Journal of Applied Physics, vol. 84, No. 8, Oct. 15, 1998, pp. 4314-4321.

Grischke et al., "Application-oriented modifications of deposition processes for diamond-like-carbon-based coatings," Surface and Coatings Technology, vol. 74-75, pp. 739-745, 1995.

* cited by examiner

CARBON FILM COATED MEMBER

This application is a continuation of U.S. application Ser. No. 10/224,345, filed Aug. 21, 2002, now abandoned, the disclosure of which, including the specification, drawings, claims, and abstract, are hereby incorporated by reference in its entirety.

BACKGROUND OF THE INVENTION

1. Field of the Invention

The present invention relates to a carbon film coated member excellent in low-friction property, wear resistance and durability, and capable of suppressing a dust generation, peeling-off and deterioration of the coated film even if the carbon film coated member is used as semiconductor equipment members such as wafer cassette, dummy wafer, probe pin or the like under severe operating conditions, so that the carbon film coated member would not exert a bad influence onto the resultant semiconductor products.

2. Description of the Related Art

Conventionally, there have been widely used various members over many technical fields. Example of the members may include: a metal member of which surface property is improved by surface modification methods such as gas nitriding methods, ion nitriding, arc-ion plating (AIP) method or the like, thereby to reduce wear of the member; and an iron/steel member of which surface layer is hardened by surface hardening treatments such as carbonizing and quenching method, nitriding method, induction hardening method, flame hardening method or the like, thereby to improve wear resistance property of the member.

On the other hand, in recent years, there has become also widely used a member in which a coating film composed of amorphous carbon is integrally formed onto a surface of a metal base material, the amorphous carbon having a high hardness and a low friction coefficient that are similar to those of diamond.

For example, Japanese Patent Application (Laid-Open. 1997) No. 5-279854 discloses a method of forming this type of the diamond film. Concretely to say, the forming method adopts a process comprising the steps of: ionizing and depositing carbon compound onto a surface of the base material thereby to form a diamond-like carbon film having a predetermined pattern; and thereafter, integrally forming diamond film having a predetermined thickness through a vapor phase synthesizing method.

According to the above forming method, a tight-adhesion property between the surface of the base material and the diamond film is enhanced, and the diamond film can be formed densely and flatly. When a tool body is coated with the above diamond film, the diamond film can be firmly adhered to the surface of the tool body, whereby a wear resistance of the tool can be improved.

On the other hand, as information technology devices represented by a computer or a mobile device have been progressed, an integration degree of a semiconductor integrated circuit to become a main component of the above devices has increased, so that it has been strongly demanded for the integrated circuit to realize a high-speed processing and downsizing of the integrated circuit.

The semiconductor device deeply dislikes an impurity to be mixed into not only starting raw material but also semi-finished products in view of securing good performances, so that each of processes for manufacturing the semiconductor device is normally performed in an environment of which atmosphere is highly cleaned-up and decontaminated as like in a clean-room. It goes without saying that it has been required for also the respective members constituting these semiconductor manufacturing devices so as not to generate any impurity components.

Further, a wafer processing step in semiconductor manufacturing process which is typically represented by dry etching, CVD sputtering and CVD, is performed in a reaction vessel, so-called, chamber of which atmosphere can be decompressed to realize a high vacuum. In general, as a material for constituting this chamber, metal members composed of aluminum or the like have been widely used in view of its high design-freedom and excellence in structural strength.

Conventionally, the metal impurity generated from an inner wall of the chamber has not raised any problems at all. However, in these days, as the integration degree of the semiconductor integrated circuit has drastically increased, it has been required to satisfy a purity standard prescribed with a higher purity level, so that material property with less impurity contamination has been required for the chamber.

As one example of the materials having less impurity contamination, graphite material has been well known. However, a general graphite material is porous in an entire structure, so that it is difficult to attain a high vacuum in the chamber. In addition, fine particles are liable to be generated due to dropping-off of fine grains constituting the graphite structure. There are some cases where the particles may contaminate the integrated circuit thereby to cause defects such as short-circuit or open-defect in the integrated circuits.

On the other hand, as a uniform carbon material having a gas-impermeability, a glassy carbon has been widely used in recent years as a member for constituting the semiconductor manufacturing devices. This glassy carbon has characteristics of that impurity contamination is extremely few and the particle generation is also small due to the uniform and continuous crystalline structure of the glassy carbon.

Further, there exist a dummy wafer as one concrete example of the member for constituting the semiconductor-manufacturing device. This dummy wafer is used as an alternate material to be substituted for a silicon wafer for the purpose of conducting an operation test of jig and machines, and for the purpose of cleaning the process line in LSI and/or VLSI manufacturing process.

In the process for manufacturing the semiconductors such as LSI and/or VLSI, a process for forming a film in accordance with chemical vapor deposition (CVD) method, physical vapor deposition (PVD) method, sputtering method or the like occupy an important position. The resultant thin film is required to provide a high uniformity. Therefore, a quality control in the film forming process and an evaluation of the thin film are indispensable elements for the semiconductor manufacturing process.

The dummy wafer is used for the quality control in the film forming process and an evaluation of a thin film. Concretely to say, the dummy wafer is used for grasping a relation between the film forming conditions such as film-forming time, wafer temperature or the like and a thickness of the film formed on the wafer, and is also used for conducting a purity analysis of the resultant film. Further, the dummy wafer is also used as a wafer for dummy sputtering operation for the purpose of preventing the particle generation due to falling-off of the film from constituent parts of a sputtering apparatus.

As previously mentioned, the step of forming a film onto the wafer in the semiconductor manufacturing process, which is typically represented by the sputtering method, CVD method, dry etching method and ion-injecting method, is performed in the reaction vessel, i.e., the chamber of which atmosphere can be decompressed to realize a high vacuum. In general, as a dummy wafer to be used for this film-forming device, a single crystal silicon wafer has been adopted because the contamination by impurity is few and the particle-generation resulting in lowering a production yield is also small. In this connection, a thickness of the single crystal silicon wafer is routinely set to about 0.725 mm.

In a case where the silicon wafer is used as the dummy wafer in the above film forming process, various films adhered and formed on the wafer are removed by means of chemical solutions or mechanical methods such as polishing or the like, thereby to regenerate the silicon wafer, and then the regenerated silicon wafer is repeatedly reused.

Further, in recent years, as disclosed in Japanese Patent Laid-Open Publication No. 10(1998)-270433 or No. 11(1999)-102847, a dummy wafer using a glassy carbon plate had been developed. However, when the glassy carbon plate is used as a plate member, it is required to form a sintered body of the glassy carbon, and then, required to perform a grinding work for the sintered body so as to obtain a predetermined size and shape. Furthermore, in order to grind the plate (sintered body) composed of the glassy carbon, it is necessarily required to use a high-priced diamond-grinding machine, thus has been a factor of increasing a manufacturing cost of the dummy wafer.

Furthermore, there exist a probe pin (probe needle) and a contact for socket (contactor) as concrete examples of the member for constituting the semiconductor-manufacturing device. These probe pin and the contact for socket are used as members for constituting an inspection device for inspecting whether the semiconductor devices such as integrated circuit (LSI) or the like are well-behaved or not.

For example, as shown in FIG. 4A and also disclosed in Japanese Patent Laid-Open Publication No. 10(1998)-221366, the probe pin 30 is composed of, for example, Re—W alloy wire, and is formed by sharpening a top portion of the wire. The top portion of the probe pin 30 is abut against Al electrode pad 38 formed on a substrate 37 thereby to enable the probe pin 30 to be electrically connected to a test circuit, whereby electrical characteristics of the electronic devices or semiconductor packages are measured.

However, the above conventional probe pin composed of Re—W alloy wire is insufficient in wear resistance and strength. Therefore, when the contact operation to contact the electrode portion is repeated, there arise a problem such that the top portion of the probe pin easily wear and/or deform thereby to lower an accuracy in shape of the probe pin. In addition, metal components of the electrode and solder are liable to adhere to the top portion of the probe pin, so that a contact resistance (junction resistance) at the probe pin is disadvantageously varied and increased. As a result, there may be posed problems such that the inspection accuracy is liable to lower and the life (duration time) of the probe pin is shortened.

On the other hand, in a case where the aforementioned pure diamond film (DLC film: Diamond-Like Carbon film) is applied to members for machine parts or tools to be used under severe conditions, when the thickness of the pure diamond film is set to be large, a stress caused in the diamond film becomes extremely large, so that there arise a fatal defect of causing a flaking exfoliation (peeling in a flake-shape) in a short period of time.

The film peeled in a flake-shape is then finely pulverized to generate powder. When the powder adheres to the semiconductor products, the powder has become a strong factor for lowering a production yield of the semiconductor products.

Further, at a member to which energy beams such as plasma, ion beam or electron shower was irradiated in a wafer-processing unit to be used in a process of manufacturing the semiconductor device, constituent element of the member was separated by the energy beams and mixed into the wafer, so that there were many cases where the mixed element exerted a bad influence onto the wafer in view of purity thereof. In addition, there was also posed a problem the member per se was liable to be easily deteriorated thereby to lower a durability of the semiconductor device.

Furthermore, in processes represented by ion-injecting treatment, dry-etching treatment, sputtering treatment for processing the wafer or liquid crystal display (LCD) substrate, a transferring unit for transfer the wafer and the glass substrate, and a wafer cassette for holding a number of wafers are essential units. In these unit and cassette, there necessarily exists a sliding portion at which semiconductor products such as wafer or the like slide to each other.

However, as the integration degree of the semiconductor integrated circuit and a pixel number of the liquid crystal display device are increased, an influence of the particles (fine grains) that are generated by rubbing and sliding of the semiconductor products at the sliding portion of the semiconductor equipment has become remarkable. Therefore, for the purpose of improving the production yield of the semiconductor products, a reduction of the particle amount has become a burning technical problem in these days.

On the other hand, in a case where glassy carbon is used as the semiconductor manufacturing apparatus member as described hereinbefore, the following drawbacks are disadvantageously posed. That is, the glassy carbon has a poor workability, and is very expensive material. In addition, it is quite difficult for the glassy carbon to provide a member having a large thickness, so that the member cannot be applied to a large-sized chamber of which size has been further increased in response to a scale-up in area of the wafer. Therefore, there has been posed a problem that it is extremely difficult to provide the member capable of being used in a stable state under a high vacuum condition.

On the other hand, according to the member formed with a film composed of only pure amorphous carbon (hereinafter referred to as "pure amorphous carbon film") as mentioned hereinbefore, although the member is excellent in low-friction coefficient and wear resistance, if the film thickness is increased so as to secure a sufficient durability in view of the severe using conditions such as the operating environment for the machine parts or tools, an internal stress of the coated film is greatly increased, whereby the flaking exfoliation is liable to occur. Therefore, there is also posed a problem that an applicable usage of the member is disadvantageously limited to a narrow range.

Furthermore, in a case where a film formation is conducted by using a silicon-wafer as a dummy wafer, when the dummy wafer is immersed into a strong acid solution for the purpose of removing various films adhered to the silicon wafer thereby to regenerate the used wafer, the silicon wafer per se is eluted into the acid solution and then remarkably thinned in a short period of time. In this situation, the thickness of the silicon wafer becomes smaller than 0.6 mm which is usually prescribed as a controlled lower limit, so that it becomes impossible to reuse or recycle the silicon wafer.

In addition, when the silicon wafer was thinned by being immersed into the acid solution, there was also a case where the wafer caused a breakage due to insufficient strength. Further, in a case where the film-removal operation was performed by a mechanical method such as polishing or the like, the silicon wafer together with the film were simultaneously polished. Therefore, the thickness of the silicon wafer was thinned to a level below the controlled lower limit, so that there existed a disadvantage such that it became impossible to repeatedly reuse the silicon wafer. In also a case of chemical polishing method such as chemical-mechano-polishing (CMP) method using chemicals, the same problems as described above had been raised.

Further, in a case where the dummy wafer is used in a wafer processing unit to which energy beams such as plasma, ion beam, electron shower or the like are irradiated as in a process of manufacturing the semiconductor device, it is not possible to use a material of which constituent element is separated by the energy beams such as plasma or the like and is mixed to the wafer so as to exert a bad influence onto the wafer in view of purity thereof.

As described hereinbefore, as the integration degree of the semiconductor integrated circuit and a pixel number of the liquid crystal display device are increased, an influence of the particles (fine grains) that are generated by rubbing and sliding of the semiconductor products at the sliding portion of the semiconductor equipment has become remarkable. Therefore, as a material for constituting the dummy wafer, it is not possible to use a material, which generates the particles by contacting to a transfer part.

As explained above, there has been also posed a requirement for the material constituting the dummy wafer so as not to exert the bad influence on a quality of the wafer, so that a suitable material having both chemical resistance and durability has been sought in these days.

On the other hand, there is also a case where a dummy wafer composed of SiC and comprising a film formed by CVD method or a dummy wafer composed of glassy carbon are used in place of the conventional dummy wafer composed of silicon. However, Sic and the glassy carbon are poor in workability and expensive materials. In addition, in a case where these materials are used, it is difficult to obtain a wafer having a large diameter of 12-inch class and a large surface area.

For example, when a dummy wafer composed of a material different from silicon was used, the following problems were posed. That is, it was impossible to perform a detecting operation for detecting a position of the dummy wafer by means of a position sensor, the detecting operation being required in quality control step and an evaluation process. In addition, there existed a problem such that it was extremely difficult to provide a dummy wafer, which can be used in a stable state under a vacuum condition.

On the other hand, according to the member in which a pure amorphous carbon film composed of only pure amorphous carbon is formed on a surface of a wafer base material, although the member (dummy wafer) was excellent in low-friction coefficient and wear resistance, if the film thickness was increased so as to secure sufficient chemical resistance and durability in view of the severe operating conditions, an internal stress of the coated film was greatly increased, whereby the flaking exfoliation was liable to occur. Therefore, there was also posed a problem that an applicable usage of the member was disadvantageously limited to a narrow range.

SUMMARY OF THE INVENTION

The present invention has been achieved to solve the above described problems and a first object of the present invention is to provide a semiconductor equipment member as a carbon film coated member excellent in low-friction property, wear resistance and durability, and capable of suppressing a dust generation, peeling-off and deterioration of the coated film even if the carbon film coated member is used under severe operating conditions, so that the carbon film coated member would not exert a bad influence onto the resultant semiconductor products.

Further, a second object of the present invention is to provide a dummy wafer excellent in recycling property, wear resistance and durability, and is free from wear of a wafer base material even if a film formed on the dummy wafer is repeatedly removed under severe operating conditions through acid cleaning and mechanical grinding or the like, and is free from particle generation which would exert a bad influence onto the resultant semiconductor products.

Furthermore, a third object of the present invention is to provide a long-lived probe pin excellent in wear resistance and strength, and is free from wear, deformation and change in contact resistance even if the probe pin is repeatedly subjected to an contact operation, and capable of maintaining a high accuracy in inspecting the semiconductor product for a long period of time thereby to provide a probe pin having a long life.

To achieve the above objects, the inventors of the present invention had eagerly made a study on the film to be coated on a base material so as to improve characteristics of the coated film. As a result, when predetermined metal and/or metal carbide was contained in a matrix composed of amorphous carbon thereby to form a film (hereinafter referred to simply as "metal (metal carbide) containing amorphous carbon") and the film was coated on at least part of a surface of a base material thereby to prepare a carbon film coated member, there could be obtained a carbon film coated member in which an internal stress of the film was remarkably mitigated and a tight-adhesion property and bonding strength between the film and the base material were improved, so that the exfoliation of the film due to flaking phenomenon could be suppressed. As a result, there could be obtained a carbon film coated member excellent in low-friction property, wear resistance, corrosion resistance, durability or the like.

In particular, when the above carbon film coated member was applied to a member for semiconductor manufacturing apparatus to which energy beams such as plasma, ion beam, electron shower or the like were irradiated in a wafer processing unit or glass substrate processing unit, there could be obtained the following findings. Namely, a separation of components constituting the member due to the energy beams was few, so that a contamination of the wafer or the like with the separated components was also few. In addition, a deterioration of the member per se is also minimal, whereby the production yield of the semiconductor device or liquid crystal display device could be efficiently improved.

Furthermore, when the member coated with the above film was used as a member constituting a sliding portion of a transfer unit for transferring the wafers or glass substrates, the following findings could be obtained. That is, a friction coefficient of the member with respect to the semiconductor products was small, and the number of particles generated due to the friction could be remarkably decreased, so that the defects due to the particles could be prevented, whereby the production yield of the semiconductor device or liquid crystal display device could be efficiently improved.

Further, the inventors of the present invention paid attention to the film for a dummy wafer, and had eagerly investigated to improve the characteristics of the film. As a result, when predetermined metal and/or metal carbide was contained in a matrix composed of amorphous carbon thereby to form a film (hereinafter referred to simply as "metal (metal carbide) containing amorphous carbon") on at least part of a surface of a wafer base material, there could be obtained a dummy wafer in which a tight-adhesion property and bonding strength between the film and the base material were improved, so that the exfoliation of the film could be suppressed. As a result, there could be obtained the dummy wafer excellent in chemical resistance, low-friction property, wear resistance, durability or the like.

In particular, when this dummy wafer was applied to a wafer processing unit or glass substrate processing unit to which energy beams such as plasma, ion beam, electron shower or the like were irradiated, there could be obtained the following findings. Namely, a separation of components constituting the wafer base material due to the energy beams was few, so that a contamination of the wafer or the like with the separated components was also few. In addition, a deterioration of the wafer base material per se is also minimal. As a result, the production yield of the semiconductor device or liquid crystal display device could be efficiently improved.

Furthermore, when the dummy wafer coated with the metal (metal carbide) containing amorphous carbon film was used as a member constituting a wafer-processing unit or glass substrate-processing unit, the following findings could be obtained. That is, a friction coefficient of the wafer with respect to wafer transferring parts was small, and the number of particles generated due to the friction could be remarkably decreased, so that the defects due to the particle generation could be prevented. As a result, the production yield of the semiconductor product or liquid crystal display device could be efficiently improved.

Furthermore, when the member coated with the above film was used as a member constituting a probe pin or a contact for socket of inspection apparatus for inspecting the semiconductor products, the following findings could be obtained. That is, there could be obtained a long-lived probe pin or the like excellent in wear resistance and strength, and was free from wear, deformation and change in contact resistance even if the probe pin was repeatedly subjected to an contact operation, and capable of maintaining a high accuracy in inspecting the semiconductor product for a long period of time thereby to provide a probe pin or the like having a long life.

The present invention had been achieved on the basis of the above findings. That is, a carbon film coated member according to the present invention is characterized by comprising: a base material; and a coated film formed on at least part of a surface of the base material, the coated film comprising: a matrix composed of amorphous carbon; and at least one of metal and metal carbide contained in the matrix, wherein an atomic ratio (M/C) of the metal (M) to carbon (C) constituting the coated film is 0.01 to 0.7.

A pure amorphous carbon film conventionally used has a dense film structure having characteristics similar to those of diamond, so that the pure amorphous carbon film has no permeability of chemicals, and has an extremely low friction coefficient and a high hardness. However, in a case where another film formed on the pure amorphous carbon film is removed by being immersed into strong acid such as hydrofluoric acid or the like, or removed by a mechanically compelling force, or in a case where a film thickness is designed to be thick so that the pure amorphous carbon film can be used under severe conditions as the operative conditions of machine parts or tools, the pure amorphous carbon film has a disadvantage such that the stress existing in the carbon film remarkably increased, so that the flaking exfoliation of the carbon film is liable to occur.

Consequently, according to the carbon film coated member of the present invention, at least one of metal and metal carbide is contained in a matrix composed of amorphous carbon so as to mitigate the aforementioned internal stress thereby to effectively suppress the flaking exfoliation of the carbon film. Therefore, even if the thickness of the carbon film is set to be thick up to about 5 μm, the increase of the internal stress in the carbon film is small, and the carbon film can maintain an excellent adhesion strength with respect to the base material. Accordingly, in a case where the carbon film is applied to a sliding member or tool or the like to be used under severe operating condition, the carbon film having a larger thickness than that of conventional one can be used.

Further, in the present invention, the metal and/or metal carbide to be contained in the matrix are not particularly limited as far as the metal and/or metal carbide exhibit a function of mitigating the stress of the matrix composed of amorphous carbon. It is preferable that the metal and/or metal carbide may be at least one selected from the group consisting of molybdenum (Mo), tungsten (W), tantalum (Ta), niobium (Nb), silicon (Si), boron (B), titanium (Ti), chromium (Cr) and carbide thereof.

In this connection, as the metal carbide, W—C, Ta—C, B—C, Nb—C, Ti—C or the like are suitably used. It is preferable that the metal and/or metal carbide are dispersed in the matrix composed of amorphous carbon as fine particles of which particle size is a level of nanometer.

As the metal element for constituting the above metal and/or metal carbide, tungsten (W) and tantalum (Ta) are particularly preferable for exhibiting an excellent chemical resistance; wear resistance, low-friction coefficient and durability. On the other hand, boron (B) can exhibit a good characteristic, while having a disadvantage of narrowing a composition range thereof. Titanium (Ti) is particularly preferable in view of reducing the material cost of the carbon film.

Furthermore, in the above invention, it is preferable that the thickness of the coated film in which particulate substances such as metal or carbide thereof are dispersed is set to 5 μm or less.

In this connection, the thickness of the coated film is measured in such a manner that the carbon film-coated member is cut by a plane passing through a central portion of the coated member thereby to obtain a cross-sectional area, and the film thickness exposed at the cross-sectional area is magnified and measured. In this case, three portions at the cross-sectional area, i.e., a central portion, right and left peripheral portions positioned at 90% of a distance from the central portion in right or left direction are selected. With respect to each of the three portions, the thickness of the coated film is repeatedly measured for fifth times. The measured results are averaged thereby to define the thickness of the coated film in the present invention.

By the way, in case of the conventional film composed of only pure amorphous carbon, the internal stress is disadvantageously increased up to about 2~6 GPa/μm, so that the flaking of the film is liable to occur. Therefore, the thickness of the film has been limited up to about 1 μm. In contrast, however, in the coated film of the present invention in which metal and/or metal carbide for mitigating the internal stress are contained, even if the coated film is formed to be thick so as to provide a thickness up to about 5 μm, the internal stress can be suppressed to 1.5 GPa/μm or less, so that the film thickness can be increased thereby to improve the durability of the film coated member, and the film coated member can be applied to the members to be used under severe conditions.

The thickness of the coated film is set to 5 μm or less in relation to the internal stress of the above coated film. However, the thickness range of 2 to 3 μm is practically suitable. In this connection, in a case where Cr as particulate substances are dispersed in the film, the thickness of the coated film can be increased up to about 30 µm.

Further, in the present invention, it is preferable that an atomic ratio (M/C) of the metal (M) to carbon (C) contained in the above coated film is set to a range of 0.01 to 0.7. If the atomic ratio (M/C) is within the above range, an adhesion force of the coated film with respect to the base material becomes high, so that there can be obtained a film composition excellent in chemical resistance and wear resistance.

Particularly, in a case where the carbon film coated member is a semiconductor manufacturing apparatus member and constitutes a sliding portion at which the carbon film coated member contacts and slides with another part or member, if the atomic ratio (M/C) in the coated film is set to a range of 0.1 to 0.5, an excellent wear resistance can be obtained.

Further, in a case where the carbon film coated member is a dummy wafer in which the film is formed on a wafer base material, it is preferable to increase the wear resistance by reducing an amount of metal component. In this case, it is more preferable to set the atomic ratio (M/C) of the metal (M) to carbon (C) in the coated film to a range of 0.05 to 0.2.

Furthermore, in a case where the carbon film coated member is a probe pin in which the carbon film is formed on a surface of the base material, it is preferable for the carbon film to secure a suitable electrically conductive and resistance value by increasing an amount of metal component, and to increase an adhesion property capable of preventing an adhesion to a counterpart or solder to be contacted. In this case, it is more preferable to set the atomic ratio (M/C) of the metal (M) to carbon (C) in the coated film to a range of 0.2 to 0.7.

The above atomic ratio can be obtained by measuring amounts of the respective elements existing at a surface portion of the amorphous carbon film containing metal (metal carbide) by means of a quantitative analysis using an EPMA (electron probe micro analyzer). In this connection, the amount of metal means a total amount of metal existing as simple element and metal existing as carbide, while the amount of carbon means a total amount of carbon constituting the metal carbide and carbon constituting the amorphous carbon.

Further, the base material for integrally forming with the film is not particularly limited as far as the base material withstands a temperature of 200° C. or lower which is a processing temperature during the film forming operation. Concretely, materials such as, for example, iron steels, aluminum, titanium, and alloy thereof, stainless steel, non-ferrous materials such as graphite, silicon or the like, ceramics materials composed of oxide, nitride, carbide or boride, glass material, resin material or the like can be preferably used. However, since a sputtering method is generally used for dispersing the particulate metal into the amorphous carbon, it is preferable to use a base material having an electrical conductivity to some extent.

Furthermore, in the present invention, when the intermediate layer having a single layer structure or a plurality of layers composed of at least one of metal, nitride, carbide, and boride is disposed between the coated film and the base material, a bonding strength between the film and the base material is increased, so that a carbon film coated member excellent in durability can be formed.

The above intermediate layer can be appropriately selected in accordance with kinds of the base materials and metal (metal carbide)-containing amorphous carbon films. The intermediate layer may have a single layer structure composed of metal, nitride, carbide, or boride, or may have a structure formed by laminating a plurality of above single layers. For example, there can be also adopted a laminar structure comprising: a metal layer formed on a side of the base material; a layer composed of metal, nitride, carbide, or boride formed on the metal layer; and the metal (metal carbide)-containing amorphous carbon film formed on the layer.

As the above intermediate layer, a metal plating layer, a nitriding layer, a carburization layer (carburizing treatment layer) or the like previously formed on the surface of the base material can be also adopted. In addition, it is also possible to form an intermediate layer composed of a metal thin film by the sputtering method thereby to improve the tight-adhesion property of the coated carbon film.

In particular, when carbide is used for the intermediate layer and even if defects such as pin-hole or the like are existing in the metal (metal carbide)-containing amorphous carbon film, it becomes possible to effectively prevent corrosion of the base material due to etchant used in an etching treatment, thus being preferable.

The semiconductor manufacturing apparatus member, dummy wafer, probe pin or the like as the carbon film coated member according to the present invention can be easily manufactured, for example, in accordance with the following procedure. Namely, carbon hydride gas such as acetylene or the like to be a raw material of amorphous carbon and argon (Ar) gas are injected into a reaction vessel of a sputtering apparatus, while a target composed of metal and/or metal carbide to be a raw material of metal and/or metal carbide and a base material mainly composed of metal or the like are disposed so as to oppose to each other in the above reaction vessel.

When a magnetron sputtering operation is performed in the above state, a reaction gas containing carbon component generated by the decomposition of the carbon hydride gas is deposited on a surface of the base material. At the same time, argon ion ($Ar^+$) collides with the target so as to flick out fine particles of the metal and/or metal carbide from the target, then the fine particles are mixed into the deposited amorphous carbon film.

An amount of the metal or metal carbide to be mixed into the amorphous carbon film can be controlled by changing conditions such as input voltage at a time of the magnetron sputtering operation, bias voltage, rotation speed of a turn table, concentration of hydrocarbon gas in the reaction vessel or the like. Further, as the hydrocarbon gas other than acetylene, methane, ethane, benzene or the like can be also used.

As a result, a coated film containing the metal and/or metal carbide in the matrix composed of amorphous carbon is integrally formed on the surface of the base material thereby to obtain the semiconductor manufacturing apparatus member or the like as the carbon film coated member of the present invention.

In this connection, a result may be changed according to kind and amount of the metal component, even if the metal components are added to the film forming material as the metal, some metal components react with the carbon component thereby to substantially exist as the metal carbide in the resulting carbon film. For example, when W (tungsten) is mixed into the carbon film, W reacts with the carbon component thereby to form WC (tungsten carbide).

According to the carbon film coated member as constructed as above, since the coated film containing the metal and/or metal carbide in the matrix composed of amorphous carbon is integrally formed on at least part of the surface of the base material, wear resistant property and low friction coefficient property of the amorphous carbon as the matrix can be exhibited. Simultaneously, the internal stress of the amorphous carbon is effectively mitigated by the metal and/or metal carbide. As a result, exfoliation (peeling) of the coated film or dust generation is few, and an excellent durability can be exhibited.

Particularly, in a case where the carbon film coated member of the present invention is used in a semiconductor apparatus as a member for constituting a sliding portion or a radiation part to which the energy beam is irradiated, a deterioration of the member, peeling of the film, particle generation (dust generation) are minimal, so that the semiconductor products can be stably manufactured with a high production yield.

More concretely, the semiconductor manufacturing apparatus member or the like as the carbon film coated member of the present invention can be used as the members to which energy beams such as plasma, ion beam, electron shower are irradiated in the wafer processing unit or glass substrate processing unit. To be more concrete, the member of this invention can be used as the member constituting the sliding portion at which the member slides while being contacted to semiconductor parts or another apparatus member in an etching apparatus, sputtering apparatus, CVD apparatus, ion-injecting apparatus, wafer transferring apparatus, glass substrate transferring apparatus.

By the way, as far as the objects of the present invention can be achieved, the present invention is not limited to apply to only above applications but also it can be applied to various semiconductor apparatus members, sliding members or the like. In addition, the carbon film coated member of the present invention can be also applied to a dummy wafer for various film forming apparatus such as optical disk, magnetic disk or the like.

Further, as another use application, the present invention can be also used for various general purposes such as kitchen equipments, hot water stopper parts, working machine member, automobile parts or members for industrial use.

BRIEF DESCRIPTION OF THE DRAWINGS

FIG. 4 is a schematic view showing a structure of a probe pin in which FIG. 4A shows a conventional probe pin while

DESCRIPTION OF THE PREFERRED EMBODIMENTS

Next, the preferred embodiments of the present invention will be described with reference to the following Examples and Comparative Example and the accompanying drawings.

EXAMPLES 1 TO 3

A nitrided layer (CrN) was previously formed on a surface of each base materials composed of stainless steel (SUS304). Then, a magnetron sputtering operation was performed with respect to each of the base materials, so that a film in which particulate substances were dispersed and having a composition and thickness indicated in Table 1 was integrally formed on the surface of the base material thereby to prepare semiconductor manufacturing apparatus members as the carbon film coated members according to the respective Examples.

Figure 1:
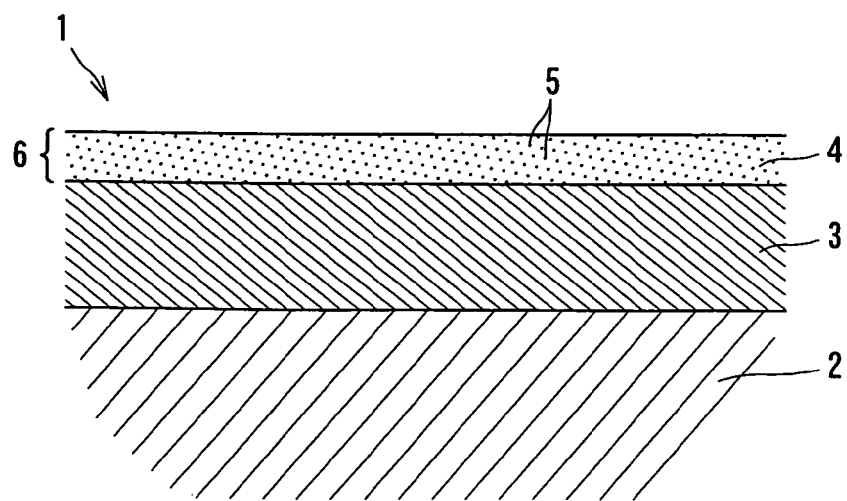
FIG. 1 is a partially cross-sectional view schematically showing a laminar structure of one embodiment of a carbon film coated member according to the present invention in case of the carbon film coated member being applied to a semiconductor manufacturing apparatus member.

As shown in FIG. 1, the semiconductor manufacturing apparatus member 1 of the respective Examples has a laminar structure in which the nitrided layer (CrN layer) as an intermediate layer 3 is formed on a surface of the base material 2 composed of SUS304, and on a surface side of the nitrided layer is integrally formed with a coated film 6 comprising: a matrix composed of amorphous carbon 4; and metal and/or metal carbide 5 contained (dispersed) in the matrix.

COMPARATIVE EXAMPLES 1

On the other hand, the same procedure as in Example 1 was repeated except that the metal and/or metal carbide were not contained and the thickness of the film was set to 1 μm. That is, only the amorphous carbon was deposited on the base material thereby to prepare semiconductor manufacturing apparatus member as the carbon film coated member of Comparative Example 1.

Next, thus prepared semiconductor manufacturing apparatus members of the respective Examples and Comparative Example were assembled into a wafer processing unit as a member constituting a plasma-radiated portion. Under the above condition, wafers were processed until an integral power consumption reached to 500 kWh.

Subsequently, with respect to each of the processed wafers, an amount of impurity particles adhered to the wafer was measured by means of a particle counter (WM-3). Then, a production yield of the acceptable wafer to be a product for sale was calculated in such a manner that defective wafers exceeding an acceptable level of impurity particles was subtracted from a total number of wafers.

In addition, a life of the respective members was measured. The life of the member was defined as a time until an exfoliation (peeling) of the coated film formed on the surface of the member was observed. In this connection, the life of the member according to each of Examples was indicated as a relative value on the basis of a standard value (100), which denotes a life of the member according to Comparative Example 1. The measured results are shown in Table 1 hereunder.

TABLE 1

| | Semiconductor Manufacturing Apparatus Member | | | | | | |
|---|---|---|---|---|---|---|---|
| | Coated Film | | Particulate Substance | | | | |
| Sample No. | Kind | Thickness (μm) | Kind | Amount (at %) | M/C Ratio in Coated Film | Production Yield (%) | Life of Member |
| Example 1 | Amorphous Carbon Film Containing Metal(Metal Carbide) | 3 | W | 11 | 0.12 | 98 | 350 |
| Example 2 | Amorphous Carbon Film Containing Metal(Metal Carbide) | 3 | Ta | 10 | 0.11 | 97 | 260 |
| Example 3 | Amorphous Carbon Film Containing Metal(Metal Carbide) | 3 | B | 22 | 0.28 | 98 | 210 |
| Comparative Example 1 | Pure Amorphous Carbon Film | 1 | — | — | 0 | 95 | 100 (Standard Value) |

As is clear from the results shown in Table 1, according to the members of the respective Examples formed with the coated film composed of amorphous carbon in which particulate substances composed of W, Ta, B are dispersed, the deterioration of the member and an amount of the generated particles were minimal in comparison with those of Comparative Example 1. Therefore, it was confirmed that the production yield of the wafer as a product could be improved.

Particularly, in the carbon film coated members of the respective Examples, the internal stress of the coated film can be mitigated by the particulate substances, so that the coated film would not be peeled off for a long time of period. Therefore, it was confirmed that an excellent life span (durability) could be obtained. Concretely, it became possible to prolong the life of the member up to 2.1 to 3.5 times longer than those of conventional ones in which only the pure amorphous carbon film was formed on the base material.

On the other hand, in case of the member of Comparative Example 1 in which the coating film composed of only the pure amorphous carbon was deposited on the base material, a stress value in the coated film was increased. Therefore, it was confirmed that only a thin film having a thickness up to 1 μm could be formed thereby to deteriorate the durability of the member.

EXAMPLES 4 TO 6

Figure 2:
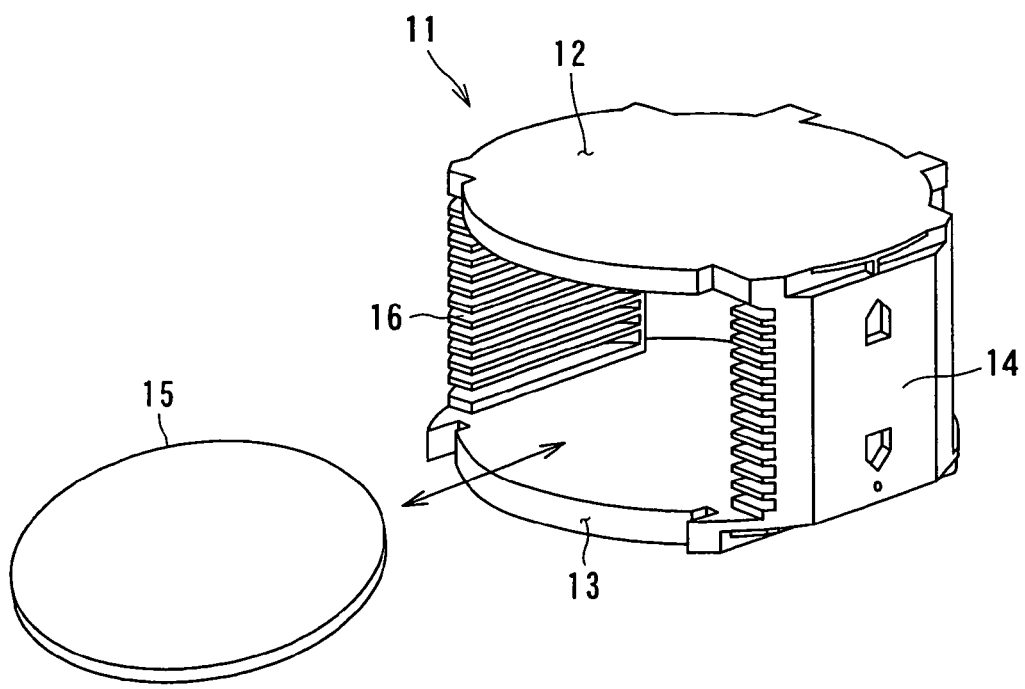
FIG. 2 is a perspective view showing another embodiment of a carbon film coated member according to the present invention in case of the carbon film coated member being applied to a wafer cassette for semiconductor manufacturing apparatus.

Open-type wafer cassettes composed of aluminum alloy were prepared as shown in FIG. 2. The wafer cassette into which a plurality sheets of wafers are inserted and held is equipped to a wafer transfer device as one element of a semiconductor manufacturing apparatus.

The wafer cassette 11 shown in FIG. 2 is constructed by comprising: a pair of plates composed of an upper plate 12 and a lower plate 13 each having a roughly circular-shape; and a pair of supporting walls 14 provided to a space between the paired plates 12 and 13 so as to oppose to each other.

Each of an inner side surface of the respective supporting walls 14 is formed with a number of holding grooves 16 into which a peripheral portion of the wafer 15 is inserted, so that the wafer 15 is held. The number of the holding grooves 16 corresponds to a sheet-number of the wafers 15 to be accommodated in the wafer cassette 11.

Then, the pluralities of the circular-disk-shaped wafers are accommodated into the wafer cassette 11 by sliding the wafers 15 into the holding grooves 16. The wafer cassette 11 accommodating the pluralities of the wafers 15 in multi-stacked manner is used for transferring the wafers 15 between the adjacent semiconductor manufacturing apparatuses.

At the time of inserting the wafer 15 into the holding groove 16 of the wafer cassette 11 or at the time of taking out the wafer 15 from the holding groove 16, the wafer 15 slides, so that sliding portions of the holding groove 16 are required to provide a high smoothness and an excellent wear resistance.

On the surfaces of the holding groove of the wafer cassette as a base material prepared as above were formed with respective coating films having compositions, thickness and containing particulate metal and/or metal carbide as indicated in Table 2, thereby to manufacture the respective wafer cassettes as the carbon film coated members according to the respective Examples.

COMPARATIVE EXAMPLES 2 TO 3

On the other hand, the same procedure as in Example 4 was repeated except that the particulate substance was not contained in the coating film and the thickness of the coated film composed of only pure amorphous carbon was set to 1 μm, thereby to manufacture a wafer cassette of Comparative Example 2 having the same size as that of Example 4. Further, a wafer cassette formed with no coating film per se was prepared as Comparative Example 3.

With respect to each of the wafer cassettes of Examples and Comparative Examples manufactured as above, an inserting operation of a wafer into the holding groove of the wafer cassette and a taking-out operation of the wafer from the holding groove were repeatedly performed for 1200 times. Then, an amount of particles adhered to each of the wafers was measured by means of a particle counter. Thereafter, a production yield of the acceptable wafer to be a product for sale was calculated in such a manner that defective wafers exceeding an acceptable level of impurity particles was subtracted from a total number of wafers.

In addition, a life of the respective members was measured. The life of the member was defined as a time until an exfoliation (peeling) of the coated film formed on the surface of the holding groove was observed. In this connection, the life of the member according to each of Examples was indicated as a relative value on the basis of a standard value (100), which denoted a life of the member according to Comparative Example 3. The measured results are shown in Table 2 hereunder.

TABLE 2

| | Coated Film | | Particulate Substance | | | Particle | | |
|---|---|---|---|---|---|---|---|---|
| Sample No. | Kind | Thickness (μm) | Kind | Amount (at %) | M/C Ratio in Coated Film | Number (P/Wafer) | Production Yield (%) | Life of Member |
| Example 4 | Amorphous Carbon Film Containing Metal(Metal Carbide) | 4 | W | 11 | 0.12 | 8 | 99 | 420 |
| Example 5 | Amorphous Carbon Film Containing Metal(Metal Carbide) | 4 | Ta | 10 | 0.11 | 7 | 98 | 310 |
| Example 6 | Amorphous Carbon Film Containing Metal(Metal Carbide) | 4 | B | 22 | 0.28 | 9 | 99 | 250 |
| Comparative Example 2 | Pure Amorphous Carbon Film | 1 | — | — | 0 | 24 | 95 | 160 |
| Comparative Example 3 | — | — | — | — | 0 | 37 | 93 | 100 (Standard Value) |

As is clear from the results shown in Table 2, according to the wafer cassettes of the respective Examples formed with the coated film composed of amorphous carbon containing metal and/or metal carbide at a surface of the holding groove which was to be a sliding portion of the wafer cassette, an wear resistant member excellent in durability could be obtained without exerting a bad influence of impurity onto the wafer. Therefore, when the member formed with the coating film as in Example is used as the sliding member of the semiconductor manufacturing apparatus, it becomes possible to mass-produce semiconductor device and liquid crystal display device, which have less defective caused by particles or dust generation, with a high production yield, and to normally mass-produce the devices under stable operating conditions.

EXAMPLE 7 AND COMPARATIVE EXAMPLES 4 to 6

Coating films composed of amorphous carbon containing W, pure amorphous carbon, $MoS_2$ (molybdenum disulfide), TiN (titanium nitride) each having practical thickness ranges shown in Table 3 were respectively formed on flat plates composed of SUS304 thereby to prepare film-coated members of Example 7 and Comparative Examples 4 to 6. Then, a friction coefficient in the above thickness range and variable range of the internal stress and Vickers hardness ($Hv_{0.05}$) of the coated films were measured thereby to obtain the following results shown in Table 3.

TABLE 3

Film formed on Plain SUS Plate

| | Coated Film | | | | Internal | Vickers |
|---|---|---|---|---|---|---|
| Sample No. | Kind | Practical Thickness Range of Film (μm) | M/C Ratio | Friction Coefficient | Stress (GPa/μm) | Hardness ($Hv_{0.05}$) |
| Comparative Example 4 | Pure Amorphous Carbon Film | 0.1~1 | 0.2 | 0.01~0.1 | 2~6 | 3000~7000 |
| Example 7 | Amorphous Carbon Film Containing W Metal(Metal Carbide) | 1~5 | 0.2 | 0.1~0.2 | 0.1~1.5 | 800~2200 |
| Comparative Example 5 | $MoS_2$ | 2~10 | 0.2 | 0.1~0.2 | 0.1~1.3 | 300~600 |
| Comparative Example 6 | TiN | 2~7 | 0.2 | 0.5~0.7 | 1~2 | 2000~2500 |

On the other hand, in case of Comparative Example 2 formed with the pure amorphous carbon film containing no particulate substance, the stress in the film was high, so that the film thickness was obliged to be reduced to 1 μm for the maximum value whereby it was reconfirmed that the durability of the coated film was low. In addition, in case of Comparative Example 3 formed with no carbon film, of course, a particle generation was rapidly increased, and it was clear that the member could not be practically used.

As is clear from the results shown in the above Table 3, the friction coefficient of the amorphous carbon film containing W metal (metal carbide) used in Example 7 was somewhat increased than that of the pure amorphous carbon film. However, the friction coefficient of the film used in Example 7 is the same level as that of a lubricating layer composed of conventional $MoS_2$, thus providing a good sliding property.

In addition, regarding the inner stress of the coated films, the stress of the film composed of pure amorphous carbon used in Comparative Example 4 was high, so that the film thickness was obliged to be limited to about 1 μm. In contrast, in case of the film composed of amorphous carbon film containing metal (metal carbide) used in Example 7, it was possible to form a thick film having a thickness up to about 5 μm. Therefore, an application range of the member of Example 7 can be extended to tools or the like that are used under severe conditions.

As to hardness of the film, the film used in Example 7 exhibited a value of 800-2200 Hv, so that wear resistance property required for the member constituting semiconductor manufacturing apparatus could be sufficiently secured.

EXAMPLE 8 TO 10 AND COMPARATIVE EXAMPLE 7

Films composed of amorphous carbon film containing metal (metal carbide) and a film composed of pure amorphous carbon shown in Table 4 were integrally formed on surfaces of cutting tool bodies each composed of hard metal alloy in accordance with the magnetron sputtering method, thereby to prepare cutting tool members of the respective Examples and Comparative Example.

Each of these cutting tool members was actually attached to a working machine, and a life span of the cutting tool member was evaluated by measuring a total working time until the film formed on the surface of the cutting tool body was peeled off. In this connection, the life of the cutting tool was indicated as a relative value on the basis of a standard value (100), which denoted a life of the member as a cutting tool according to Comparative Example 7. The measured results are shown in Table 4 hereunder.

ting tools. However, the carbon film coated member of the present invention is not limited to the above application range but also applicable to the following members. Namely, it is needless to say that the carbon film coated member of the present invention can be also applied to members requiring to suppress a sticking phenomena and adhesion phenomena, and applied to members required to satisfy all characteristics of chemical resistance, low friction property and wear resistant property.

Next, embodiments of the carbon film coated members according to the present invention will be explained more concretely on the basis of the following Examples and Comparative Examples in which the carbon film coated members are applied to dummy wafers.

EXAMPLES 11 TO 16

Films composed of amorphous carbon film having compositions and thickness shown in Table 5 were integrally formed on surfaces of 8-inch single crystal silicon wafers in accordance with the magnetron sputtering method, thereby to prepare dummy wafers 21 as carbon film coated members of the respective Examples. The components shown in Table 5 were dispersed in thus coated films as particulate substances. Further, intermediate layers composed of carbides shown in Table 5 were formed on the surface of the wafer.

Figure 3:
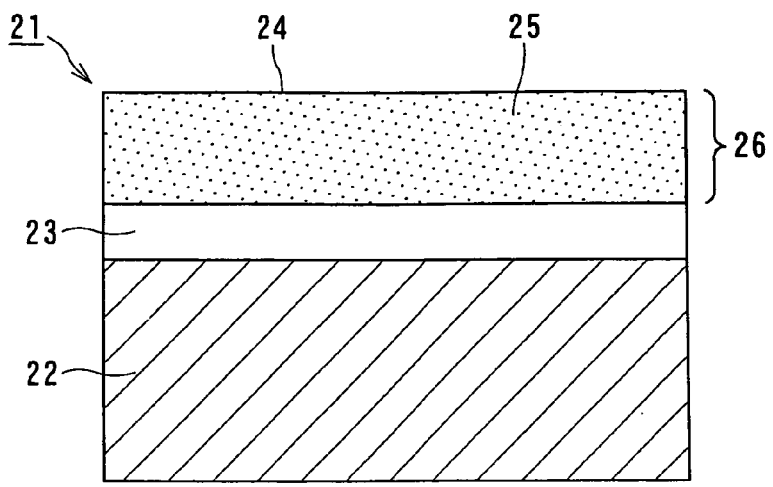
FIG. 3 is a partially cross-sectional view schematically showing a laminar structure of one embodiment of a carbon film coated member according to the present invention in case of the carbon film coated member being applied to a dummy wafer.

As shown in FIG. 3, each of the dummy wafers 21 of Example 11-16 has a laminar structure in which a carbide (WC) layer as the intermediate layer 23 is formed on a surface of a wafer base material 22 composed of single crystal silicon, and the coated film 26 comprising a matrix composed of

TABLE 4

| | | Cutting Tool | | | | |
| --- | --- | --- | --- | --- | --- | --- |
| | | Particulate Substance | | | Film | |
| Sample No. | Coated Film | Kind | Amount (at %) | M/C Atomic Ratio of Film | Thickness (μm) | Life of Tool |
| Example 8 | Amorphous Carbon Film Containing Metal(Metal Carbide) | W | 11 | 0.12 | 5 | 375 |
| Example 9 | Amorphous Carbon Film Containing Metal(Metal Carbide) | Ta | 10 | 0.11 | 5 | 290 |
| Example 10 | Amorphous Carbon Film Containing Metal(Metal Carbide) | B | 22 | 0.28 | 5 | 230 |
| Comparative Example 7 | Pure Amorphous Carbon Film | — | — | 0 | 1 | 100 (Standard Value) |

As is clear from the results shown in Table 4, according to the cutting tool members of the respective Examples integrally formed with the coated film in which predetermined metal and/or metal carbide were contained (dispersed) in the amorphous carbon matrix, a close-adhesion property of the film was excellent in comparison with that of Comparative Example 7, so that it was evidenced that the lives of members of Examples were greatly extended 2.3 to 3.7 times longer than that of conventional one thereby to exhibit as excellent durability.

In the above respective Examples, the present invention has been explained on embodiments in which the carbon film coated members formed with amorphous carbon film containing metal (metal carbide) were applied to members constituting the semiconductor manufacturing apparatus and cut-amorphous carbon 24 and metals 25 dispersed in the matrix is integrally formed on a surface of the carbide layer 23.

Further, a single crystal silicon wafer having no coated film was prepared thereby to provide a dummy wafer of Comparative Example 8. In addition, the same procedure as in Example 11 was repeated except that the M/C atomic ratio was set to 0.8, thereby to prepare a dummy wafer of Comparative Example 9.

Next, with respect to thus prepared dummy wafers, an operation of removing the coated film using an acid solution was conducted thereby to investigate the chemical resistance of the respective dummy wafers. Namely, thus prepared dummy wafers of Examples 11-16 and Comparative Examples 8-9 were immersed in a fluoronitric acid solution (hydrofluoric acid:nitric acid:water=1:1:10) for five hours.

Thereafter, a change in thickness of the respective dummy wafers due to acid corrosion was investigated, thereby to obtain the results shown in Table 5 hereunder.

In case of Examples 11 and 12, the change in thickness of the dummy wafers was also measured when the dummy wafers were immersed in the acid solution for 30 hours. The results are also shown in Table 5.

Ti/TiN layer and Al layer were alternatively formed on each of the dummy wafers 21 of Examples 11-16 and Comparative Example 8 thereby to form a five-layered laminated films (sputtered films) each comprising the Ti/TiN layer and Al layer.

Then, the dummy wafers 21 deposited with the sputtered films were immersed in the fluoronitric acid solution as pre-

TABLE 5

| Sample No. | Wafer Base Material | Coated Film | | | | Amount of Change in Thickness of Dummy Wafer | |
|---|---|---|---|---|---|---|---|
| | | Component Contained | M/C Atomic Ratio | Intermediate Layer | Thickness (μm) | Immersion for 5 Hours | Immersion for 30 Hours |
| Example 11 | Silicon | W | 0.17 | WC | 8.2 | 0 | 0 |
| Example 12 | Silicon | W | 0.25 | WC | 4.5 | 0 | 0.1 |
| Example 13 | Silicon | Si | 0.33 | SiC | 13.6 | 0 | — |
| Example 14 | Silicon | Si | 0.40 | SiC | 4.3 | 0 | — |
| Example 15 | Silicon | Ta | 0.22 | WC | 2.8 | 0 | — |
| Example 16 | Silicon | Ta | 0.38 | SiC | 4.2 | 0 | — |
| Comparative Example 8 | Silicon | — | 0 | — | — | 85 | — |
| Comparative Example 9 | Silicon | W | 0.8 | WC | 8.2 | 65 | — |

As is clear from the results shown in Table 5, according to the dummy wafers of Examples 11-16 in which the amorphous carbon films containing particulate metals such as W, Si, Ta or the like were formed and the intermediate layers composed of metal carbides were formed, the change in thickness of the wafers was not raised at all in any case of the metals of W, Si, Ta being contained in the coated films even if the dummy wafers were subjected to the immersion test in the fluoronitric acid solution for 5 hours. Therefore, it was confirmed that the dummy wafers of Examples had an excellent corrosion resistance.

Further, in case of the dummy wafer of Example 11 in which the film thickness was set to 8 μm or more, it was confirmed that there was no change in thickness of the dummy wafer even if the dummy wafer was subjected to the immersion test in the fluoronitric acid solution for 30 hours. In view of this fact, it can be said that a film thickness of 8 μm or more is more preferable for an application range requiring a more excellent corrosion resistance.

On the other hand, in case of the dummy wafers of Comparative Example 8 in which the coating film was not formed, a reduction of 85 μm in thickness occurred after the immersion test in the fluoronitric acid solution for 5 hours. Therefore, it was difficult for the dummy wafer to be repeatedly used.

Further, in case of Comparative Example 9 in which M/C atomic ratio was set to be large so as to exceed 0.9, it was also confirmed that the corrosion resistance of the amorphous carbon film was disadvantageously lowered.

In view of the above facts, when the coating film into which W, Si, Ta were dispersed as the particulate substances was formed on the dummy wafer body, it was confirmed that there could be obtained an improved resistance property (chemical resistance) against the deposited film-removing operation which is to be performed when the dummy wafer was repeatedly used.

viously mentioned thereby to remove the sputtered films. Thereafter, the thickness of each of the dummy wafers was measured. As a result, there was no change in thickness of the dummy wafer in any of Examples 11-16 even if the film-removing operation was repeated for 10 times or more. This fact means that the wafer base material per se would not be damaged even if the dummy wafers of Examples 11-16 are subjected to the film-removing operation using the fluoronitric acid solution for more than 10 times. In view of this advantage, the dummy wafers of Examples 11-16 can repeatedly perform the film-removing operation. Therefore, the dummy wafers could be confirmed to exhibit a sufficient durability (corrosion resistance) enough to endure the repeatedly reuse.

On the other hand, when the dummy wafer of Comparative Example 8 was subjected to the operation of removing the sputtered films, the wafer thickness was remarkably changed. Concretely, after completion of the film removing operation for 5 times, the wafer thickness became less than 0.6 mm, so that it became impossible to reuse the dummy wafer.

As is clear from the above results, according to the dummy wafers of Examples 11-16, there was no change in thickness even if the dummy wafers were subjected to the film-removing operation using the fluoronitric acid solution over 10 times. Therefore, a sheet number of the dummy wafers to be prepared can be economized whereby the manufacturing cost of the dummy wafers can be sufficiently cut down.

Furthermore, at the time of the sputtering operation using the dummy wafer of Examples 11-16, the number of particles generated from each of the dummy wafers was investigated. As a result, an increase of the particles could not be observed at all, and the number of the particles was drastically reduced in comparison with the case where the dummy wafer having no coated film was subjected to the sputtering operation. Namely, it was confirmed that the dummy wafers formed with the coating film as in Example 11-16 exhibited a significant effect of preventing the particle generation exerting a bad influence onto quality of the resultant products.

Accordingly, when the dummy wafer formed with the coating film as in Examples 11-16 is used for the semiconductor manufacturing apparatus, it becomes possible to normally mass-produce the semiconductor device and the liquid crystal display device under a stable condition with a high production yield, and capable of lessen the defectives to be caused by the generation of the particles or dusts.

EXAMPLE 17 TO 22

Coating films having compositions, thickness, intermediate layers and particulate substances dispersed in the films shown in Table 6 were integrally formed on surfaces of 8-inch single crystal silicon wafers in accordance with the magnetron sputtering method, thereby to prepare dummy wafers 1 as carbon film coated members of the respective Examples 17-22. The components shown in Table 6 were dispersed in thus coated films as particulate substances. Further, intermediate layers composed of carbides shown in Table 6 were formed on the surface of the wafer. Further, a silicon wafer formed with no coating film was prepared as Comparative Example 10.

Ti/TiN layer and Al layer were alternately formed on each of the dummy wafers of Examples 17-22 and Comparative Example 10 thereby to form a five-layered laminated films (sputtered films) each comprising the Ti/TiN layer and Al layer. Thereafter, these sputtered films were mechanically removed by means of a lapping apparatus thereby to investigate the change in thickness of the respective dummy wafers.

In addition, a number of times (repeatable times, usable times) of the dummy wafer were also investigated. The repeatable times is defined as a repeating times of the film removing operation which is repeatedly performed until the thickness of the dummy wafer is reduced to 0.6 mm or lower due to the corrosion thereof. The thickness of 0.6 mm is a lower limit of the wafer being available as a dummy wafer. The results are shown in table 6 hereunder.

were subjected to the film-removing operation which was repeatedly performed over 10 times.

Further, in case of Example 17 in which the film thickness was set to 8.7 μm so as to exceed 8 μm, there was no change (reduction) in thickness even after the film-removing operation was repeatedly performed over 20 times.

On the other hand, when the dummy wafer of Comparative Example 10 formed with no coated film was subjected to the operation of removing the sputtered films, the wafer thickness was rapidly changed. Concretely, after completion of the film removing operation for 3 times, the wafer thickness became less than 0.6 mm, so that it became impossible to reuse the dummy wafer.

In view of the above facts, when the coating film composed of amorphous carbon containing the metal is formed on the surface of the silicon wafer thereby to form the dummy wafer of Examples 17-22, the times of repeatedly using the dummy wafer can be drastically improved. A reuse ratio of the dummy wafer is increased, so that the cost required for the dummy wafer can be reduced.

Furthermore, according to the dummy wafers of Examples 17-22, there can be provided a dummy wafer excellent in wear resistance. As a result, the particle generation exerting a bad influence on the quality of the resultant products can be effectively prevented, so that the production yield can be also improved.

EXAMPLE 23 TO 26

Coating films having compositions, thickness, and intermediate layers shown in Table 7 were integrally formed on surfaces of 8-inch glass wafers and 8-inch alumina ($Al_2O_3$) wafers in accordance with the magnetron sputtering method, thereby to prepare dummy wafers as carbon film coated members of the respective Examples 23-26. The metal components shown in Table 7 were dispersed in thus coated films as particulate substances. Further, the intermediate layers composed of metal carbides shown in Table 7 were formed on the surface of the wafer.

Further, a glass wafer formed with no coating film was prepared as Comparative Example 11, while an alumina wafer formed with no coating film was prepared as Comparative Example 12.

TABLE 6

| Sample No. | Wafer Base Material | Coated Film | | | | Usable Times of Dummy Wafer (Times) |
| | | Component Contained | M/C Atomic Ratio | Intermediate Layer | Thickness (μm) | |
| --- | --- | --- | --- | --- | --- | --- |
| Example 17 | Silicon | W | 0.15 | Cr | 8.7 | 20 or more |
| Example 18 | Silicon | W | 0.27 | WC | 5.2 | 10 or more |
| Example 19 | Silicon | Si | 0.25 | CrN | 4.3 | 10 or more |
| Example 20 | Silicon | Si | 0.38 | SiC | 5.5 | 10 or more |
| Example 21 | Silicon | Ta | 0.25 | WC | 3.9 | 10 or more |
| Example 22 | Silicon | Ta | 0.34 | CrN | 5.4 | 10 or more |
| Comparative Example 10 | Silicon | — | 0 | — | — | 3 |

As is clear from the results shown in Table 6, according to the dummy wafers of Examples 17-22 formed with the intermediate layers composed of metal carbides and amorphous carbon films containing particulate metals such as W, Si, Ta or the like, the change (reduction) in thickness of the dummy wafer was not raised at all in any case of the metals of W, Si, Ta contained in the coated films even if the dummy wafers Thus prepared dummy wafers of Examples 22-26 and Comparative Examples 11-12 were immersed in a dilute hydrofluoric acid solution (hydrofluoric acid:water=1:10) for five hours. Thereafter, a change in thickness of the respective dummy wafers due to acid corrosion was investigated, thereby to obtain the results shown in Table 7 hereunder.

TABLE 7

| Sample No. | Wafer Base Material | Coated Film | | | | Amount of Change in Thickness of Dummy Wafer |
|---|---|---|---|---|---|---|
| | | Component Contained | M/C Atomic Ratio | Intermediate Layer | Thickness (μm) | |
| Example 23 | Glass | W | 0.17 | WC | 4.7 | 0 |
| Example 24 | Glass | W | 0.26 | WC | 5.3 | 0 |
| Example 25 | Alumina | Si | 0.29 | SiC | 4.7 | 0 |
| Example 26 | Alumina | Si | 0.42 | SiC | 5.5 | 0 |
| Comparative Example 11 | Glass | — | 0 | — | — | 27 |
| Comparative Example 12 | Alumina | — | 0 | — | — | 15 |

As is clear from the results shown in Table 7, according to the dummy wafers of Examples 23-26 in which the amorphous carbon coating films containing particulate metals composed of W or Si were formed and the intermediate layers composed of metal carbides were formed, the change in thickness of the wafers was not raised at all in any case of the wafer base material composed glass or alumina, as the same manner as in Examples 11-16.

On the other hand, in case of the dummy wafers of Comparative Example 11-12 in which the coating films were not formed, a reduction of 27 μm in thickness was occurred for the glass wafer, while a reduction of 15 μm in thickness was occurred for the alumina wafer.

In view of the above facts, regardless of whether the wafer base material was composed of glass or alumina, when the amorphous carbon coated-film containing metal was formed on the surface of the wafer base material, it was confirmed that the chemical resistance of the dummy wafer could be improved.

That is, in case of the dummy wafers of Examples 23-26, a resistance property (chemical resistance) against the film-removing operation using the hydrofluoric acid solution was excellent even in a case where the wafer base material was composed of a material other than silicon. As a result, there can be provided a dummy wafer suitable for being repeatedly reused. Therefore, the cost required for the dummy wafers can be reduced. Thus being effective to reduce the manufacturing cost. In addition, since the glass and alumina are relatively easy to be worked and can be used as the base materials, the cost required for the dummy wafers can be further reduced.

Further, when the dummy wafer formed with the coating film as in Examples 23-26 is used for the semiconductor manufacturing apparatus, it becomes possible to normally mass-produce the semiconductor device and the liquid crystal display device under a stable condition with a high production yield, and capable of lessen the defectives to be caused by the generation of the particles or dusts.

Furthermore, in case of the dummy wafers of Examples 23-26 formed with the coating films, the particulate substances are contained in the coated film, so that the internal stress in the coated film can be mitigated by the action of the particulate substance. Therefore, even if the coated film is formed to be thick so as to provide a thickness of about 5 μm, an exfoliation (peeling-off) of the coated film due to a chemical solution would not occur, thereby to obtain an excellent chemical resistance.

As explained as above, according to the dummy wafers according to the respective Examples, the coating film containing metal and/or metal carbide in the matrix composed of amorphous carbon (i.e., amorphous carbon coating film containing metal and/or metal carbide) is formed on at least part of the wafer base material, so that the chemical resistance, wear resistance and friction property of the wafer base material are effectively improved. In addition, the internal stress in the coated film composed of the amorphous carbon can be effectively mitigated by the action of the metal and/or metal carbide contained in the coated film, so that exfoliation of the coated film and dust generation are few thereby to exhibit an excellent durability.

Further, in the dummy wafers according to the respective Examples, even if the wafer base material is composed of either glass or alumina, the chemical resistance and wear resistance can be improved by forming the amorphous carbon coating film containing metal and/or metal carbide onto the wafer base material.

Particularly, when the dummy wafer of the present Examples is used for the semiconductor manufacturing apparatus, the particle generation (dust generation) to be caused by sliding of the wafer with another sliding portion can be effectively prevented, so that the semiconductor products can be stably manufactured with a high production yield.

Next, embodiments of the carbon film coated members according to the present invention will be explained more concretely on the basis of the following Examples and Comparative Examples in which the carbon film coated members are applied to a probe pins and a contact (contactor) for socket.

EXAMPLE 27 TO 32

Figure 4A:
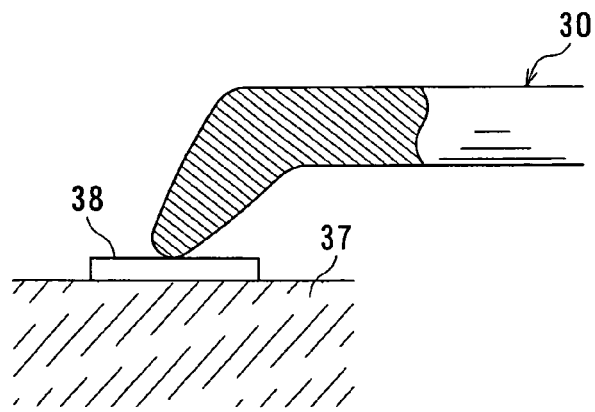
Figure 4B:
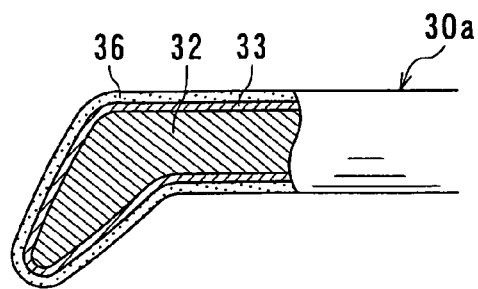
FIG. 4B is a view partially cross-sectioned showing one embodiment of a carbon film coated member according to the present invention in case of the carbon film coated member being applied to a probe pin.

Tungsten base material 32 containing 5 mass % of rhenium (Re) and having a wire diameter of 0.1 mm was worked so as to provide a shape shown in FIG. 4B. Thereafter, intermediate layers 33 composed of carbides shown in Table 8 were formed on surfaces of the respective tungsten base materials 32. Subsequently, coating films 36 each having composition, M/C atomic ratio, film thickness and containing particulate substances shown in Table 8 were formed on the tungsten base materials 32 in accordance with the magnetron sputtering method, thereby to prepare probe pins 30a of the respective Examples. The particulate substances were dispersed in the coated films 36.

As shown in FIG. 4B, each of the probe pins 30a of the respective Examples has a laminar structure in which the carbide layer as the intermediate layer 33 is formed on the surface of the base material 32 composed of Re—W alloy, and the coating film 36 comprising a matrix composed of amorphous carbon 4 and metal and/or metal carbide 5 contained (dispersed) in the matrix as shown in FIG. 1 is integrally formed on the surface side of the carbide layer.

COMPARATIVE EXAMPLE 13 TO 14

On the other hand, the same procedure as in Example 27 was repeated except that the coating film and the intermediate layer were not coated, thereby to prepare a probe pin 30 of Comparative Example 13 composed of only Re—W alloy material as shown in FIG. 4A. In addition, the same procedure as in Example 27 was repeated except that the M/C atomic ratio was set to 0.001, thereby to prepare a probe pin of Comparative Example 14.

With respect to the thus prepared probe pins 30a and 30 of the respective Examples and Comparative Examples, a contact resistance value was measured thereby to obtain the results shown in Table 8 hereunder. In this regard, the contact resistance value was measured in such a manner that each of the probe pins was repeatedly applied to an Al-electrode pad 38 (see FIG. 4A) for 200,000 times with a contact load of 10 gf, thereafter the contact resistance value of the probe pin was measured.

TABLE 8

| | Coated Film | | | | |
|---|---|---|---|---|---|
| Sample No. | Component Contained | M/C Atomic Ratio | Intermediate Layer | Thickness (µm) | Contact Resistance (Ω) |
| Example 27 | W | 0.20 | WC | 3.2 | 0.4 |
| Example 28 | W | 0.55 | WC | 4.5 | 0.5 |
| Example 29 | Si | 0.26 | SiC | 3.6 | 0.6 |
| Example 30 | Si | 0.47 | SiC | 4.3 | 0.7 |
| Example 31 | Ta | 0.29 | WC | 2.8 | 0.6 |
| Example 32 | Ta | 0.54 | SiC | 4.2 | 0.8 |
| Comparative Example 13 | — | 0 | — | — | 6.5 |
| Comparative Example 14 | W | 0.001 | WC | 3.2 | 80 |

As is clear from the results shown in Table 8, according to the probe pin 30a of the respective Examples formed with the coated film 36 composed of amorphous carbon in which the particulate substances such as W, Si and Ta were dispersed, an increase of the contact resistance value was not observed in comparison with Comparative Example 13 formed with no coating film 36. Therefore, when the probe pin of Examples was used as a contact pin for a probe card, it was confirmed that an accuracy of the inspection for the semiconductor devices could be greatly improved.

Particularly, in the probe pins 30a of the respective Examples, the internal stress of the coated film 36 could be mitigated by the particulate substances. Therefore, even if the coated film 36 was formed to be thick close to 5 µm, there was no change in the contact resistance value, whereby it was confirmed that an excellent life characteristic (adhesion resistance) could be obtained.

On the other hand, in case of the probe pin 30 of Comparative Example 13 formed with no coated film, the adhesion resistance against Al-adhesion at the Al-electrode pad was poor, thus being confirmed that the contact resistance value was increased thereby to cause a life-deterioration of the probe pin.

Further, when the M/C atomic ratio was set to less than 0.01 as in Comparative Example 14, the amount of the metal component in the coated film was small, so that the small amount of the metal component rather exerted a bad influence on the contact resistance value.

Furthermore, a top end portion of the probe pin of the respective Examples formed with the coated film was observed. However, an adhesion of Al component onto the probe pin was not recognized at all in any case of Examples, thus being confirmed that each of the probe pins had an excellent adhesion resistance. Accordingly, when the probe pin formed with the coated film as in Examples is used as a member for inspecting the semiconductor devices, electrical characteristics of the devices can be normally measured under a stable condition, so that it becomes possible to inspect the semiconductor devices and the liquid crystal display devices with a high accuracy.

EXAMPLE 33 TO 38

Figure 5:
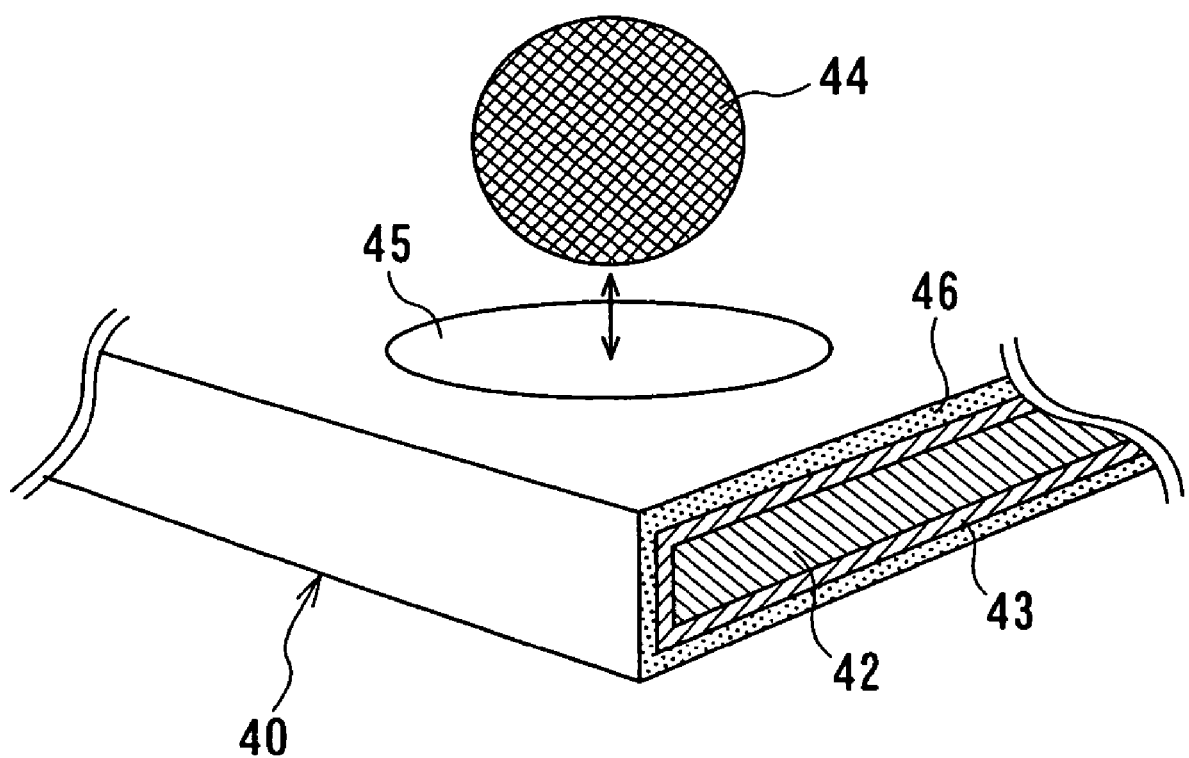
FIG. 5 is a perspective view partially in cross section showing still another embodiment of a carbon film coated member according to the present invention in case of the carbon film coated member being applied to a contact for socket.

Beryllium-copper (Be—Cu) alloy base material 42 subjected to Au-plating treatment was worked so as to form a shape shown in FIG. 5. Thereafter, intermediate layers 43 composed of chromium (Cr), carbides or nitrides shown in Table 9 were formed on surfaces of the respective beryllium-copper alloy base material 42. Subsequently, coating films 46 each having composition, M/C atomic ratio, film thickness and containing particulate substances shown in Table 9 were formed on the Be—Cu alloy base material 42 in accordance with the magnetron sputtering method, thereby to prepare contacts 40 for socket of the respective Examples to be used for a BGA (Ball Grid Array) package. The particulate substances shown in Table 9 were dispersed in the coated films 46.

As shown in FIG. 5, each of the contact 40 for socket of the respective Examples has a laminar structure in which the chromium layer, the carbide layer, or nitride layer as the intermediate layer 43 are formed on the surface of the base material 42 subjected to Au-plating treatment, and the coating film 46 comprising a matrix composed of amorphous carbon 4 and metal and/or metal carbide 5 contained (dispersed) in the matrix as shown in FIG. 1 is integrally formed on the surface side of the intermediate layer. The contact 40 for socket is configured so that a solder ball 44 of the BGA package repeatedly contacts with a contact portion 45 of the contact 40 for socket.

COMPARATIVE EXAMPLE 15

On the other hand, the same procedure as in Example 33 was repeated except that the coating film and the intermediate layer were not coated, thereby to prepare a contact for socket of Comparative Example 15 composed of only Be—Cu alloy material subjected to Au-plating treatment.

With respect to the thus prepared contacts for socket of the respective Examples and Comparative Examples, a contact resistance value was measured thereby to obtain the results, shown in Table 9 hereunder. In this regard, the contact resistance value was measured in such a manner that each of the solder ball 44 was repeatedly applied to the contact portion 45 of the contact for socket 40 for 200,000 times with a contact load of 10 gf, thereafter the contact resistance value of the contact for socket 40 was measured.

TABLE 9

| | Coated Film | | | | |
|---|---|---|---|---|---|
| Sample No. | Component Contained | M/C Atomic Ratio | Intermediate Layer | Thickness (µm) | Contact Resistance (mΩ) |
| Example 33 | W | 0.27 | Cr | 3.7 | 400 |
| Example 34 | W | 0.67 | WC | 5.2 | 400 |
| Example 35 | Si | 0.35 | CrN | 4.3 | 400 |
| Example 36 | Si | 0.55 | SiC | 5.5 | 400 |

TABLE 9-continued

| Sample No. | Coated Film | | | | |
| --- | --- | --- | --- | --- | --- |
| | Component Contained | M/C Atomic Ratio | Intermediate Layer | Thickness (μm) | Contact Resistance (mΩ) |
| Example 37 | Ta | 0.31 | WC | 3.9 | 400 |
| Example 38 | Ta | 0.49 | CrN | 5.4 | 400 |
| Comparative Example 15 | — | 0 | — | — | 1000 |

As is clear from the results shown in Table 9, according to the contacts for socket of the respective Examples formed with the coated film 46 composed of amorphous carbon in which the particulate substances such as W. Si and Ta were dispersed, a change of the contact resistance value was not observed in comparison with Comparative Example 15 formed with no coating film 46. Therefore, when the contact 40 for socket of Examples was used as a contact for socket of an inspection apparatus, it was confirmed that the accuracy of the inspection for the semiconductor devices could be greatly improved.

Particularly, in the contacts for socket of the respective Examples, the internal stress of the coated film 46 could be mitigated by the particulate substances. Therefore, even if the coated film 46 was formed to be thick so as to exceed 5 μm, there was no increase of the contact resistance value, whereby it was confirmed that an excellent life characteristic (adhesion resistance) could be obtained.

As described above, according to the probe pin and the contact for socket of the respective Examples, the coating film containing metal and/or metal carbide in the matrix composed of amorphous carbon is formed on at least part of the base material, so that the chemical resistance, wear resistance and low friction property of the base material are effectively improved. Simultaneously, the internal stress of the amorphous carbon can be effectively mitigated by the action of the metal or metal carbide contained in the coated film. As a result, the exfoliation of the coated film and dust generation are not occurred thereby to exhibit an excellent durability.

Particularly, in a case where the probe pin and the contact for socket of the respective Examples are used as a member of an inspection apparatus for inspecting the semiconductor products, an electrode portion of the probe pin or the contact for socket is free from an adhesion of soft metals, so that a stable contact resistance can be obtained. Accordingly, an available life of the probe pin and the contact for socket as the members for the inspection can be prolonged, and the semiconductor products can be stably inspected with a high accuracy.

As has been explained as above, according to the carbon film coated member of the present invention, since the coated film containing at least one of the metal and metal carbide in the matrix composed of amorphous carbon is integrally formed on at least part of the surface of the base material, wear resistant property and low friction coefficient property of the amorphous carbon as the matrix can be exhibited. Simultaneously, the internal stress of the amorphous carbon is effectively mitigated by the metal and/or metal carbide. As a result, exfoliation (peeling) of the film or dust generation is few, and an excellent durability can be exhibited.

Particularly, in a case where the carbon film coated member of the present invention is used in a semiconductor apparatus as a member for constituting a sliding portion or a radiation part to which the energy beam is irradiated, a deterioration of the member, peeling of the coated film, particle generation (dust generation) are minimal, so that the semiconductor products can be stably manufactured with a high production yield.

What is claimed is:

1. A semiconductor manufacturing apparatus member having an electrical conductivity, comprising:
   a base material,
   a coated film formed on at least part of a surface of said base material, said coated film comprising: a matrix comprising amorphous carbon and a metal contained in said matrix, and
   an intermediate layer disposed between the said coated film and said base material, said intermediate layer having a single layer structure or a plurality of layers, wherein the intermediate layer comprises chromium nitride,
   wherein an atomic ratio (M/C) of metal (M) to carbon (C) constituting said coated film is 0.01 to 0.7,
   wherein said at least one of metal contained in said matrix is at least one selected from a group consisting of tungsten, tantalum, and boron, and
   wherein said coated film containing said at least one of metal has a thickness of 5 μm or less and has an internal stress of 1.5 GPa/μm or less.

2. The semiconductor manufacturing apparatus member according to claim 1, wherein said semiconductor manufacturing apparatus comprises a wafer or glass processing unit to which at least one of a plasma, an ion beam or an electron shower is irradiated and which comprises the member.

3. The semiconductor manufacturing apparatus member according to claim 2, wherein said wafer or glass processing unit comprises an etching device, a sputtering device, a CVD device, or an ion injecting device.

4. The semiconductor manufacturing apparatus member according to claim 1, wherein said semiconductor manufacturing apparatus member constitutes a sliding portion which contacts and slides with a semiconductor part or a device member.

5. The semiconductor manufacturing apparatus member according to claim 4, wherein said atomic ratio (M/C) of the metal (M) to carbon (C) contained in said coated film is 0.1 to 0.5.

6. The semiconductor manufacturing apparatus member according to claim 1, wherein the coated film is manufactured by a magnetron sputtering process which uses a metal sputtering target in a sputtering apparatus filled with carbon hydride gas and argon gas.

7. The semiconductor manufacturing apparatus member according to claim 1, wherein the intermediate layer further comprises at least one of chromium and tungsten carbide.

* * * * *